(12) United States Patent
Kanaoka

(10) Patent No.: US 8,015,499 B2
(45) Date of Patent: Sep. 6, 2011

(54) DECODER AND REPRODUCING DEVICE

(75) Inventor: Toshikazu Kanaoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 979 days.

(21) Appl. No.: 11/981,461

(22) Filed: Oct. 31, 2007

(65) Prior Publication Data

US 2008/0104486 A1    May 1, 2008

(30) Foreign Application Priority Data

Oct. 31, 2006  (JP) ................. 2006-295980

(51) Int. Cl.
*H03M 13/00* (2006.01)
*H03M 13/03* (2006.01)

(52) U.S. Cl. ........................ 715/780; 714/796

(58) Field of Classification Search ............... 714/780, 714/795, 796; 375/262, 341
See application file for complete search history.

(56) References Cited

U.S. PATENT DOCUMENTS

| | | | |
|---|---|---|---|
| 6,446,236 B1 | 9/2002 | McEwen et al. | |
| 6,756,872 B2 * | 6/2004 | Penther | 335/229 |
| 6,901,119 B2 * | 5/2005 | Cideciyan et al. | 375/341 |
| 7,130,257 B2 | 10/2006 | Taguchi et al. | |
| 7,633,377 B2 * | 12/2009 | Sadr | 340/10.1 |
| 2004/0061964 A1 | 4/2004 | Akamatsu | |
| 2005/0120286 A1 | 6/2005 | Akamatsu | |

FOREIGN PATENT DOCUMENTS

| | | |
|---|---|---|
| JP | 2001-176213 | 6/2001 |
| JP | 2002-164946 | 6/2002 |
| JP | 2004-086994 | 3/2004 |
| JP | 2004-127408 | 4/2004 |
| JP | 2005-166089 | 6/2005 |

OTHER PUBLICATIONS

Japanese Office Action issued Sep. 28, 2010, Japanese App. No. 2006-295980 (first page only), (No Translation).

* cited by examiner

*Primary Examiner* — Phung M Chung
(74) *Attorney, Agent, or Firm* — Greer, Burns & Crain, Ltd.

(57) ABSTRACT

A reproducing device performs decoding by propagating the reliability, and detects micro medium defects to correct the reliability information. The decoder has an internal decoder, external decoder and a defect detector which calculates a moving average value of a soft-input signal, acquires a scaling factor from this, and manipulates the reliability information of the internal decoder. Since micro-defects can be detected accurately and the reliability information of the internal decoder is manipulated, error propagation due to micro defects can be suppressed.

18 Claims, 14 Drawing Sheets

| INPUT PREVIOUS STATUS k-1 | CURRENT STATUS k | | DECODER INPUT dij | |
|---|---|---|---|---|
| | 0 | 1 | 0 | 1 |
| $S^0$ | $S^0$ | $S^1$ | -2 | -1 |
| $S^1$ | $S^2$ | $S^3$ | 0 | 1 |
| $S^2$ | $S^0$ | $S^1$ | -1 | 0 |
| $S^3$ | $S^2$ | $S^3$ | 1 | 2 |

FIG. 11 234

- 250: EXPECTED VALUE AND σ REGISTER
- 251: BM COMPUTATION
- 252: PM MEMORY
- 253: ACS COMPUTATION
- 254: PATH MEMORY
- 256: Δ COMPUTATION
- 257: LIKELIHOOD UPDATE
- 258: LIKELIHOOD MEMORY
- 259: (summing junction)
- 261: (multiplier)

BM: Branch Metric
ACS: Add Compare Select
PM: Path Metric

Inputs/Signals:
- SAMPLE VALUE $y_k$
- PRIORI LIKELIHOOD INFORMATION $L_a(u_k)$
- SCALING FACTOR $\alpha_k^n$
- $d^{ij}, \sigma^{ij}$
- JUDGMENT RESULT
- $\Delta_k$
- $\hat{L}(u_k)$
- DECODED DATA (SOFT INFORMATION) $L_e(u_k)$

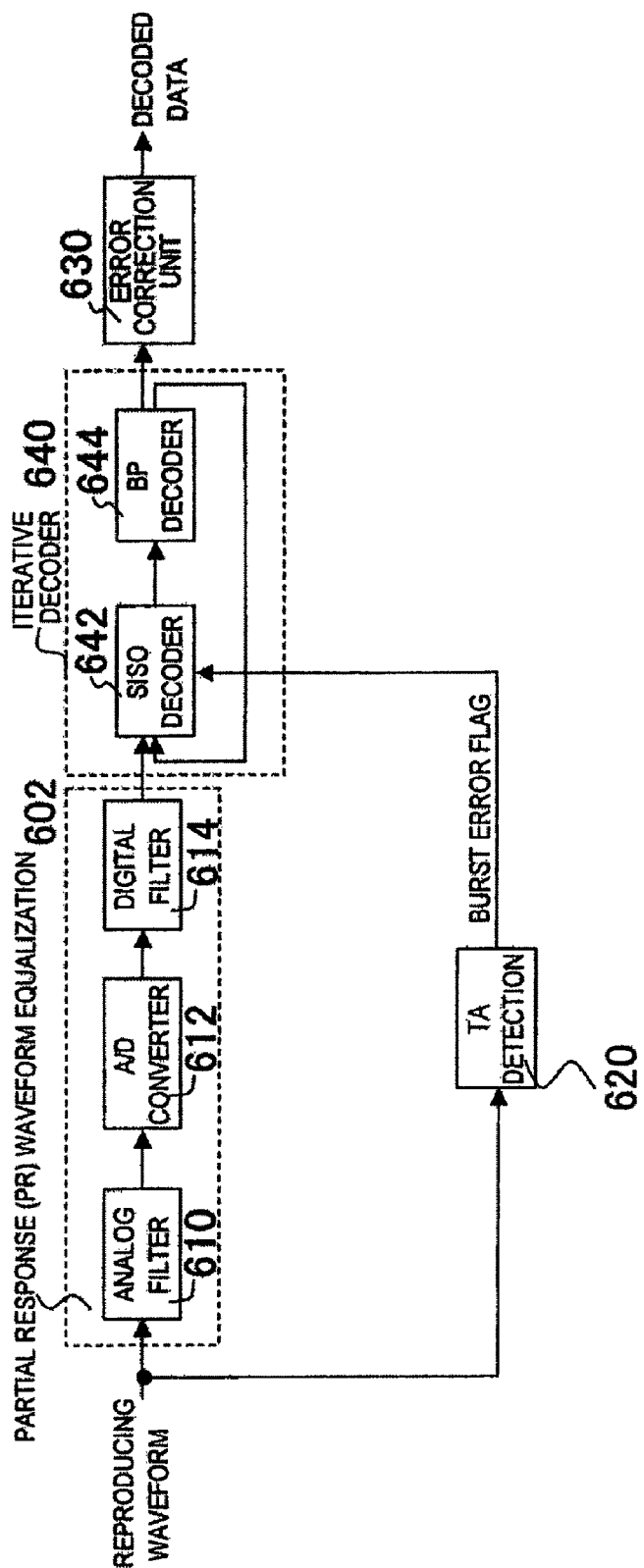

000
DECODER AND REPRODUCING DEVICE

CROSS-REFERENCE TO RELATED APPLICATIONS

This application is based upon and claims the benefit of priority from the prior Japanese Patent Application No. 2006-295980, filed on Oct. 31, 2006, the entire contents of which are incorporated herein by reference.

BACKGROUND OF THE INVENTION

1. Field of the Invention

The present invention relates to a decoder and a reproducing device for decoding by propagating reliability information between an internal decoder and an external decoder, and more particularly to a decoder and information reproducing device for detecting a defective section from a signal read from medium and manipulating reliability information of an internal decoder.

2. Description of the Related Art

Recently digital signal processing systems, which perform iterative decoding using turbo codes for propagating reliability and low density parity check (LDPC) codes, are receiving attention.

For example, errors which occur in a storage medium, such as a magnetic disk, are roughly divided into random errors and burst errors. The random errors are errors which are distributed over a wide range without long continuance. Whereas the burst errors are continuous errors which are generated by a defect in the media and thermal asperity (TA), which is unique to hard disk drives.

The major characteristic of a iterative decoding system is that erred information in codes which have largely relation acquired from large blocks and randomness, can be corrected by a plurality of correct information at a distance position based on the propagation of reliability information. A iterative decoding system has high capacity to correct the randomly distributed information by the reliability propagation.

FIG. 16 is a block diagram depicting a reproducing device using conventional iterative decoding. As FIG. 16 shows, the iterative decoding system has a plurality of decoders (e.g. soft-input soft-output (SISO) decoder 642 for PR channel, and belief propagation (BP) decoder 644 for low density parity check code), as a iterative decoder 640. And errors are corrected by mutually propagating the reliability information (also called "likelihood information") "0" and "1". Some types of iterative decoders perform iterative decoding only within the belief propagation (BP) decoder 644.

In other words, a reproducing waveform reproduced from the recording medium via a head receives a known inter-signal interference from a PR waveform equalizer 602. In other words, in the PR waveform equalizer 602, the reproducing waveform passes through an analog filter 610 and is input to an analog/digital converter (A/D converter) 612. The A/D converter 612 performs digital sampling according to a sampling clock. A digital-sampled sampling waveform passes through a digital filter 614 and is equalized to a desired partial response (PR), and a PR equalized series is obtained.

A first decoder (SISO decoder) 642 for the PR channel outputs the most likely reliability information corresponding to recorded data "0" and "1". Also based on the check information (e.g. parity bit) added to the recorded data, a second decoder (BP decoder) 644 performs error check, and updates the reliability information.

Then the updated reliability information is fed back to the first decoder 642. This iterative operation is performed under predetermined conditions, and finally the reliability information is judged as binary data "0" and "1", and iterative decoding completes. The decoded data after the iterative decoding is error-corrected by an error correction unit 630, such as an ECC correction circuit, and a decoded data string is acquired.

However if a burst error occurs in the recoding device due to a drop in signal amplitude, which is generated by a defect in the medium, incorrect reliability information is randomly dispersed and propagated, which spreads error information and makes decoding impossible.

To handle this burst error, a thermal asperity detector 620 is installed, so that the reproducing waveform is judged by a fixed threshold value, thermal asperity is detected, and a erasure flag is output. A method for suppressing the propagation of incorrect reliability information by inputting this erasure flag to a first decoder 642 and setting the reliability information in this position to "0" (undefined) has been proposed (e.g. Japanese Patent Application Laid-Open No. 2004-127408).

Another method under proposal is that when RLL (Run Length limited) code modulation is used, a constraint violation of the RLL code is recognized by the output of a first decoder 642, so as to specify the location of the burst error, and the reliability information, which is the output of the first decoder 642, is regarded as undefined (e.g. Japanese Patent Application Laid-Open No. 2005-166089).

Although this is not a method for handling defects of a medium, a method of correcting the branch metrics in a maximum-likelihood decoder according to an instantaneous drop in the amplitude of a reproducing signal in a communication path has also been proposed (Japanese Patent Application Laid-Open No. 2002-164946).

However, in the case of the method of correcting the reliability information of the iterative decoder in a conventional iterative decoding system, which targets a burst error, the reliability information is set to "0" (undefined) only when a clear amplitude abnormality (e.g. drop, level saturation) is generated.

A defect of a medium, however, is not always one that spreads over a wide area in this way, but may be a local defect (called a "micro defect"). This micro defect could possibly cause serious error propagation, and with prior art, it is difficult to correct reliability information when such a micro defect occurs. Also the reliability information is set to "0" when a defect is detected, so it is difficult to effectively correct reliability information for a micro defect.

Also in the case of a prior art targeting reproducing signals on a communication path, if inter-symbol interference occurs in signals to be reproduced and if multi-value levels must be detected, that is, if channel reproducing signals having inter-symbol interference, such as PR signals, are decoded, correct identification point signals may be corrected by mistake, which deteriorates performance.

SUMMARY OF THE INVENTION

With the foregoing in view, it is an object of the present invention to provide a decoder and a reproducing device which suppress error propagation due to a micro defect of a medium, and decode channel reproducing signals having inter-symbol interference using the propagation of reliability information.

It is another object of the present invention to provide a decoder and a reproducing device which detect the degree of error due to a micro defect of a medium by channel reproducing signals having inter-symbol interference, and correct the reliability information.

It is still another object of the present invention to provide a decoder and a reproducing device which suppress the error propagation of the reliability information due to a micro defect of a medium, and implement stable decoding.

To achieve these objects, a decoder of the present invention has: a soft-input soft-output decoder for decoding a channel reproducing signals which have inter-symbol interference; a soft-input decoder for decoding external encoding; and a weighting computing unit for detecting both sided amplitude fluctuation of a soft-input signal of the soft-input soft-output decoder, and outputting a weight value according to the drop in amplitude, wherein a soft-output value of the soft-input soft-output decoder is decreased by the weight value, and reliability information is propagated and decoded between the soft-input soft-output decoder and the soft-input decoder.

An information reproducing device of the present invention has: a waveform equalizer for equalizing a reproducing waveform into channel reproducing signals which have inter-symbol interference; a soft-input soft-output decoder for decoding the channel reproducing signals; a soft-input decoder for decoding external encoding; and a weighting computing unit for detecting both sided amplitude fluctuation of a soft-input signal of the soft-input soft-output decoder, and outputting a weight value according to the drop in amplitude, wherein a soft-output value of the soft-input soft-output decoder is decreased by the weight value, and reliability information is propagated and decoded between the soft-input soft-output decoder and the soft-input decoder.

In the present invention, it is preferable that the weighting computing unit further has: an absolute value encoding section for reflecting the soft input signal at an amplitude center value; a moving average computing section for computing a moving average in a predetermined range; a normalization computing section for dividing the moving average value by an average value of all the absolute value signals; and a weighting generation section for generating the weight value as "1" when the normalization computing value is "1" or more, and as the normalization computing value when the normalization computing value does not exceed "1".

In the present invention, it is also preferable that when the normalization computing value is a threshold T or less, the weighting generation section further generates a weight value of "0" or more and less than T.

In the present invention, it is also preferable that the weighting computing section further has: a separation section for setting the amplitude center value of the soft-input signal as 0, and separating the soft-input signal into an upper signal having a value of 0 or more and a lower signal having a value of less than 0; an upper signal moving average computing section for computing a moving average in a predetermined range for the upper signal; a lower signal moving average computing section for computing a moving average in a predetermined range for the lower signal; an upper side normalization computing section for dividing the upper side moving average value by an average value of all the upper side signals; a lower side normalization computing section for driving the lower side moving average value by an average value of all the lower side signals; a composite computing section for combining the upper and lower normalization computing values; and a weighting generation section for generating the weight value as "1" when the composite computing value is "1" or more, and as the normalization computing value when the composite computing value does not exceed "1".

In the present invention, it is also preferable that when the normalization computing value is threshold T or less, the weighting generation section further generates a weight value "0" or more and less than T.

In the present invention, it is also preferable that the soft-input soft-output decoder further has a reliability weighting section for generating a weighting reliability information by multiplying the reliability information, that is the soft-output signal, by an n-th power weighting value, which is the weighting value output from the weighting computing section raised to the n-th power (n is 1 or more).

In the present invention, it is also preferable that the soft-input soft-output decoder further has a branch metric computing section for generating reliability information based on an Euclidian distance between a soft-input signal and a soft-input expected value, and a weighting soft-input expected value computing section for multiplying the soft-input expected value by a weight value which is output from the weighting computing section.

In the present invention, it is also preferable that the soft-input soft-output decoder further has a branch metric computing section for generating reliability information based on an Euclidian distance between the soft-input signal and the soft-input expected value, and a weighting branch metric computing section for generating a weighting branch metric by multiplying the branch metric computing result by a n-th power weight value, which is the weight value output from the weighting computing section raised to the n-th power (n is 1 or more).

In the present invention, it is also preferable that the normalization computing section sets the central value of a soft-input expected value of the soft-input soft-output decoder to 0, and uses a resulting value when the total of the absolute values thereof is divided by 2 as an average value of the absolute values.

In the present invention, it is also preferable that the first and second normalization computing sections set the central value of a soft-input expected value in the soft-input soft-output decoder to 0, and use a resulting value when the total of expected values of 0 or more is divided by 2 as the average value of all the upper signals, and a value, when the total of expected values less than 0 is divided by 2 as the average value of all the lower signals.

A moving average value is computed for simple threshold detection, and this acquires a scaling factor, so micro-defects can be accurately detected, and the reliability information of the soft-input soft-output decoder is manipulated, therefore error propagation due to micro defects can be suppressed.

BRIEF DESCRIPTION OF THE DRAWINGS

FIG. 11 is a block diagram depicting the second embodiment of the defect correction decoder in FIG. 1;

FIG. 16 is a block diagram depicting a conventional iterative decoding system.

DESCRIPTION OF THE PREFERRED EMBODIMENTS

Figure 1:
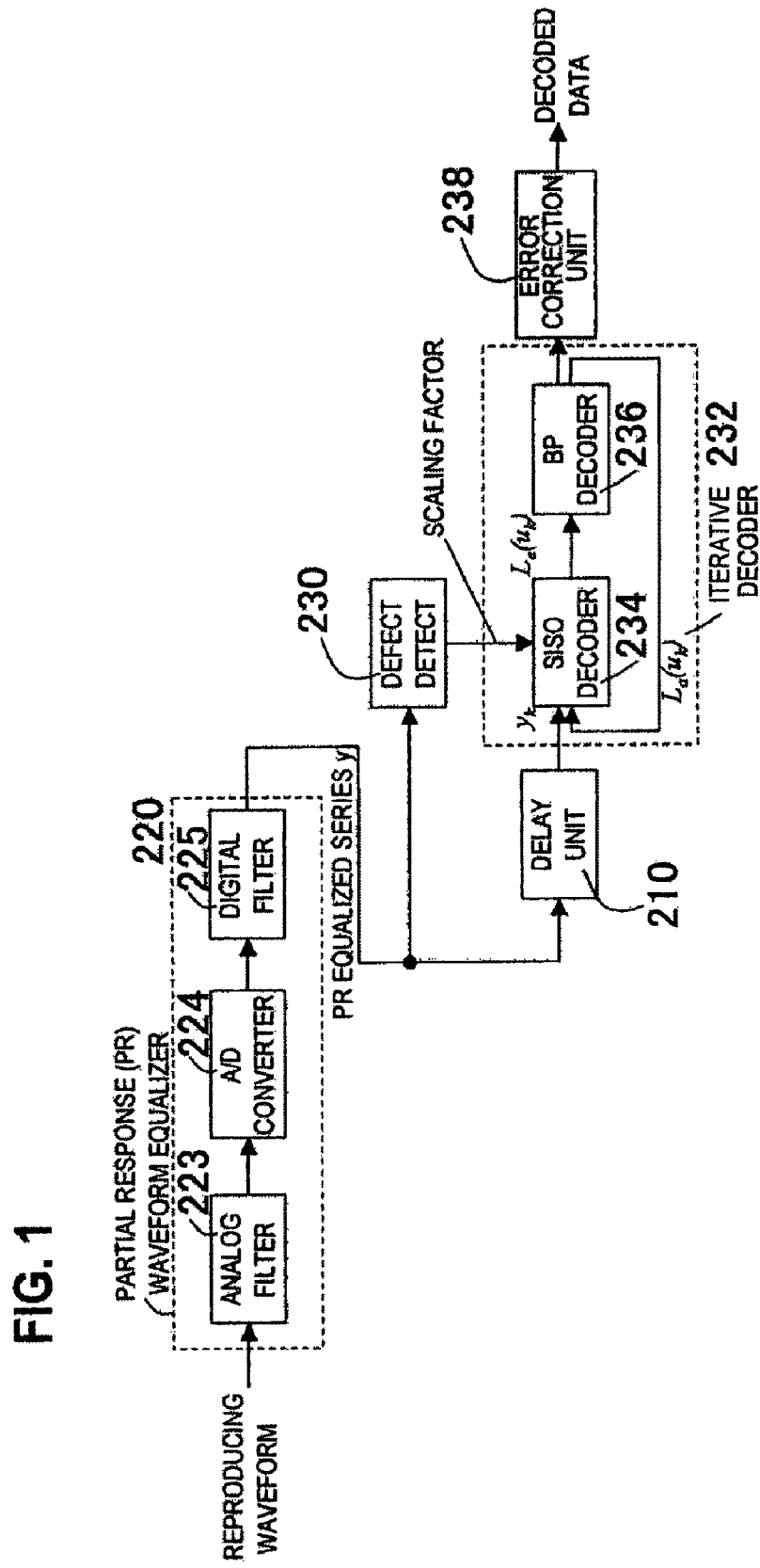
FIG. 1 is a block diagram depicting an embodiment of a recording/reproducing device according to the present invention.
Figure 2:
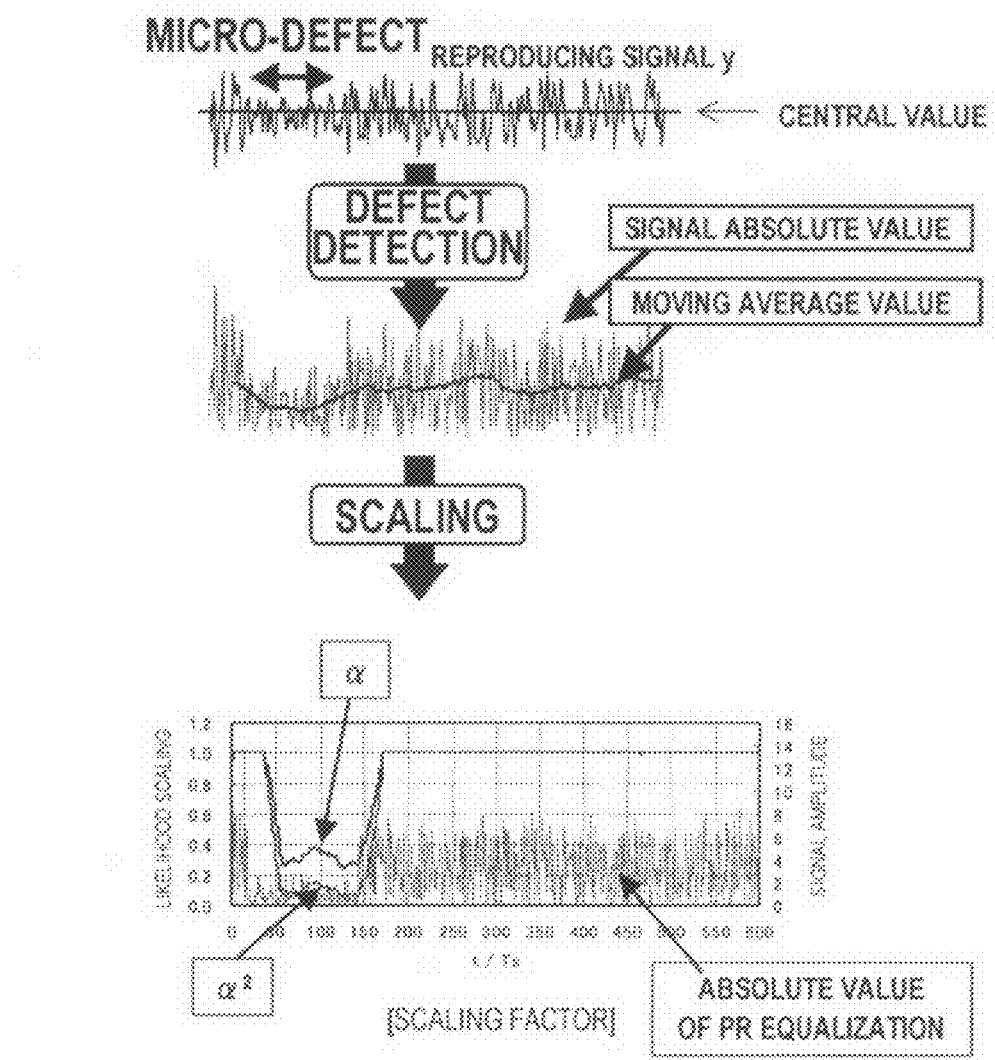
FIG. 2 is a diagram depicting a defect detection of a defect detector and reliability correction operation in FIG. 1.
Figure 3:
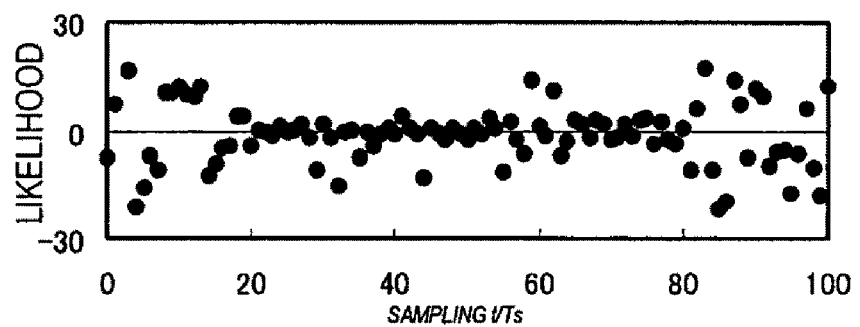
FIG. 3 is a diagram depicting distribution of reliability information according to a comparison example of the present invention.
Figure 4:
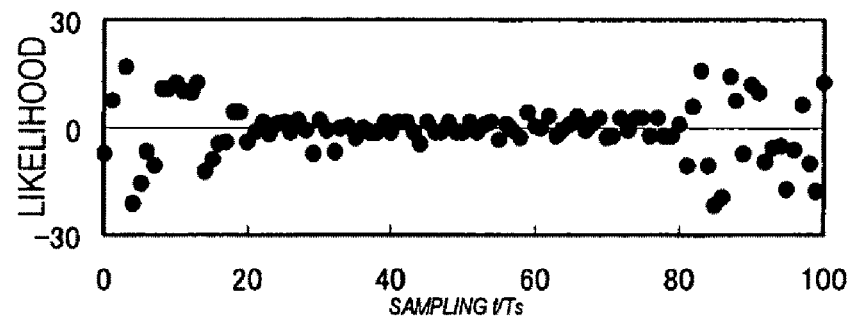
FIG. 4 is a diagram depicting distribution of reliability information according to an embodiment of the present invention.

Embodiments of the present invention will now be described in the sequence of recording/reproducing device, defect detector, first embodiment of defect correction decoder, second embodiment of defect correction decoder, third embodiment of defect correction decoder, fourth embodiment of defect correction decoder, another embodiment of detect detector, another embodiment of recording/reproducing device, and other embodiments, but the present invention is not limited to these embodiments.
Recording/Reproducing Device FIG. 1 is a block diagram depicting an embodiment of a recording/reproducing device of the present invention, FIG. 2 is a diagram depicting a reliability information correction operation based on the medium defect detection in FIG. 1, and FIG. 3 and FIG. 4 are diagrams depicting reliability information based on the scaling correction in FIG. 1 and FIG. 2. FIG. 1 shows a iterative decoding type recording/reproducing device of a magnetic disk device.

A reproducing waveform in FIG. 1 is data of a magnetic disk read by a head and amplified by a preamplifier, which is not illustrated. The data of the magnetic disk is user data to which an error correction code (ECC) is added, comprised of K bits of data and M bits of parity added. For the parity code, LDPC (Low Density Parity Code), SPC (Single Parity Code) and turbo code, for example, can be used.

The reproducing waveform from this head is adjusted for amplitude by a variable gain amplifier, which is not illustrated, and is input to a PR (Partial Response) waveform equalization section 220. In the PR waveform equalization section 220, an analog (low pass) filter (LPF) 223 cuts a high frequency band of the reproducing signal of which amplitude has been adjusted, and an A/D converter (ADC) 224 converts the analog output thereof into digital signals. Then a digital filter 225, such as an FIR (Finite Impulse Response) filter, performs waveform equalization, and PR equalized series y is acquired.

The PR equalized series y is delayed in a delay unit 210 by the amount of delay generated due to the defect detection operation of a defect detector 230, and is input to the iterative decoder 232. The iterative decoder 232 is comprised of a soft-input soft-output (SISO) decoder 234 for the PR equalized series y, and a belief propagation (BP) decoder 236 for low density parity check (LDPC) code.

For the soft-input soft-output decoder 234, BCJR (Bahl-Cocke-Jelinek-Raviv), MAP (Maximum A Posteriori) decoder, and SOVA (Soft Output Viterbi Algorithm), for example, are used.

For the belief propagation decoder 236, Sum-Product (SP) decoding and Min-Sum decoding, for example, are used. The iterative decoding method here is LDPC as an example, but turbo code and single parity check (SPC) code, for example, may be decoded.

The iteratively decoded data string is error-corrected by an error correction decoder 238 using error correction codes, and user data is output. The error correction decoder 238 is an ECC decoder, for example.

In the iterative decoder 232, reliability information Le (uk) and La (uk) for the recorded data "0" or "1" are repeatedly propagated between the SISO decoder 234 and the BP decoder 236, and the BP decoder 236 and the SISO decoder 234, under predetermined conditions. After iteration is over, the reliability information is hardly judged as "0" and "1", and is output to the error correction unit 238.

Then as FIG. 2 shows, the defect detector 230 computes a moving average in an L sampling length for a signal acquired by reflecting the input signal y of the soft-input soft-output decoder at the center level of the signal (this becomes an absolute value signal if "0" is the center).

The moving-averaged signal is divided by an average level value of the input signal y (average value in sampling length sufficiently longer than L) for normalization. And from the quotient, a scaling factor $\alpha$, which is limited to "1" when the quotient is "1" or more, is generated. In other words, as FIG. 2 shows, the scaling factor $\alpha$ is "1" if the quotient is "1" or more, and is the quotient itself if the quotient does not exceed "1".

The reliability information of the SISO decoder 234 is manipulated by this scaling factor $\alpha$. This scaling factor $\alpha$ is raised to the n-th power (n is 1 or more). One of the following methods is used for the operation of the SISO decoder 234.

A. The output value (reliability information) Le (uk) of the SISO decoder 234 is directly multiplied by the scaling factor $\alpha^n$. This method can be implemented without changing the configuration of the SISO decoder 234.

B. When the SISO decoder 234 is a maximum likelihood decoder which has a plurality of state transitions, a branch metric in a state transition is multiplied by the scaling factor $\alpha^n$. This method can continue decoding while remaining in a previous state of the BP decoder 236, and can improve the accuracy of the reliability information.

C. When the SISO decoder 234 is a maximum likelihood decoder which has a plurality of state transitions, an expected value (identification point level) in the state transition is multiplied by the scaling factor $\alpha^n$. This method can exhibit a kind of AGC function for letting the expected value follow the signal amplitude, and can sufficiently decode defects as well.

D. The above method C and method A or B are used simultaneously.

The scaling factor for manipulation is a power of $\alpha$ here because as FIG. 2 shows, the manipulation variable $\alpha^n$ decreases as the power n increases, since $\alpha$ is "1" or less. As mentioned above, the scaling factor is determined by the moving average value of the amplitude of an equalized signal, and the moving average value of a sampling point decreases mildly compared with the drop in amplitude of an equalized signal, as shown in FIG. 2, since the amplitude value before and after a sampling point is added.

If the entry of noise (particularly circuit noise) is low, power n is decreased, and if the entry of noise is high, power n is increased to decrease the influence of noise on the moving average.

FIG. 3 and FIG. 4 show the distribution of reliability information depending on the multiplication of the scaling factor, with respect to the state of the SISO decoder 234. Both FIG. 3 and FIG. 4 shows the distribution of the likelihood (reliability information) of the micro-defect portion in FIG. 2, where FIG. 3 shows the distribution before the scaling factor is multiplied, and FIG. 4 shows the distribution after the scaling factor is multiplied.

In FIG. 3, the likelihood disperses because of the defect. In FIG. 4, after correction with the scale factor, on the other hand, the likelihood of the defect section is confined to within a predetermined range near "0". In other words, as FIG. 4 shows, the influence of the defect of the medium can be eliminated, and error propagation can be suppressed.

In this way, even if a small medium defect, which cannot be detected by prior art, exists, error propagation to be generated by this defect can be suppressed, and data can be reproduced with stable iterative decoding.

Defect Detector

Figure 5:
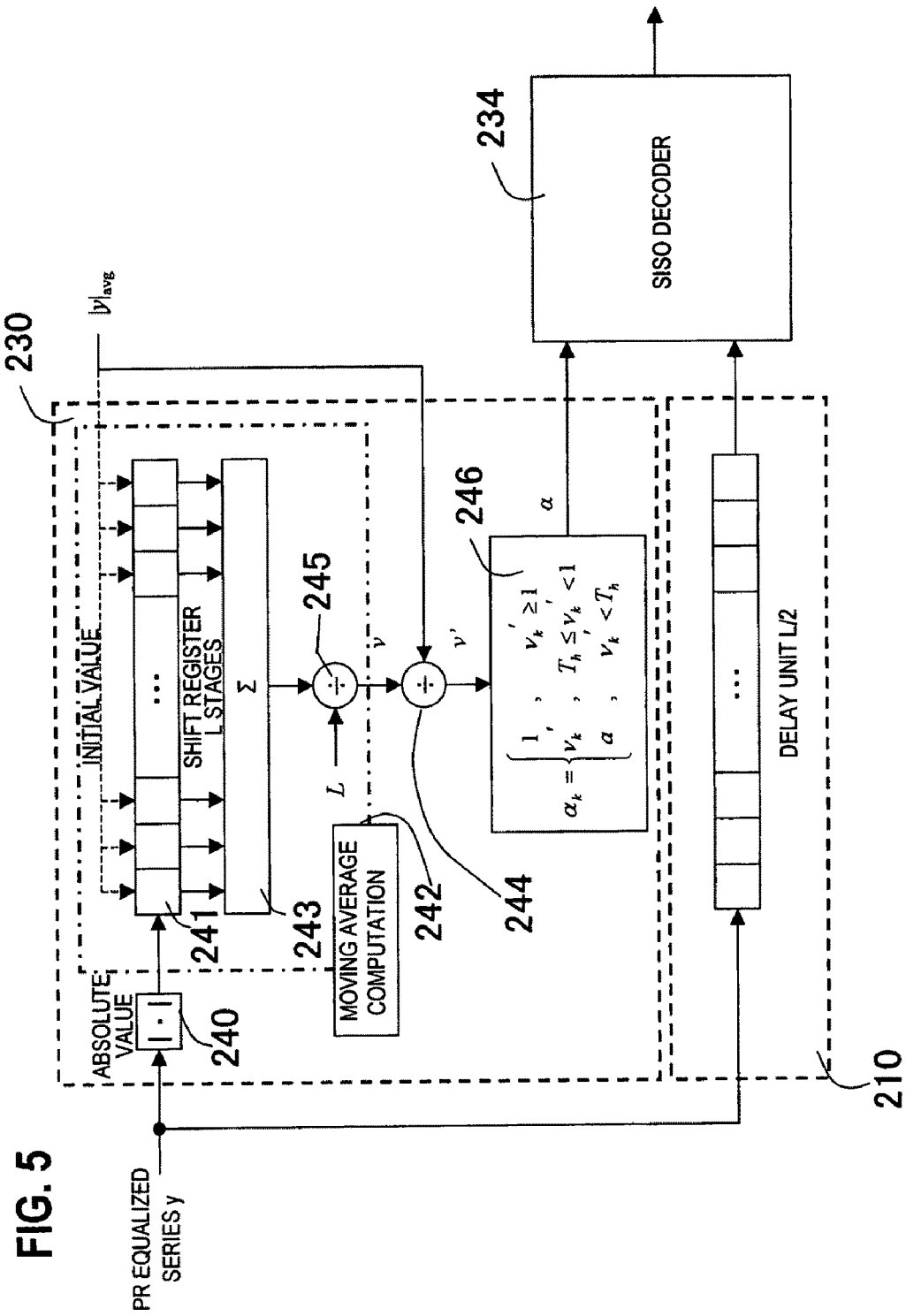
FIG. 5 is a block diagram depicting the first embodiment of the defect detector in FIG. 1.

Now the configuration of the defect detector 230 in FIG. 1 will be described. FIG. 5 is a block diagram depicting the defect detector 230 in FIG. 1.

As FIG. 5 shows, the defect detector 230 comprises an absolute value computing section 240, a moving average computing section 242, a normalization section 244 and a scaling factor conversion section 246.

The absolute value computing section 240 sets the central value (average value) of the signal of the PR equalized series y to "0", as shown in FIG. 2, and computes the absolute value |y| of the PR equalized series. In other words, the average value of the PR equalized series y is calculated, and the absolute value of the PR equalized series y is calculated with the average value as "0".

The moving average computing section 242 computes the moving average of the range of L samples for the absolute value |y| of the PR equalized series. The moving average value vk is calculated by the following Expression (1).

[Expression 1]

$$v_k = \frac{1}{L} \sum_{n=-L/2}^{+L/2} |y_{k+n}| \quad (1)$$

In other words, the moving average value vk in k samples is calculated by adding the absolute values |y| in the range of L samples with the sampling point k at the center, and dividing the result by the range L. This range L is preferably a power of 2 in order to decrease the calculation volume in the division. In other words, the division can be performed by bit shift.

In this case, $L=2^m$, and m is greater than the PR restricted length (e.g. in the case of PR-4, the restricted length is "3" because the possible values are 1, 0 and −1). That is, m>PR restricted length. This means that if m is the PR limit length or less, the generation of all the PR patterns is not guaranteed, and therefore a detection error may occur.

The moving average computing section 230 is comprised of the L stages of the shift register 241 for the above mentioned L samples, an addition circuit 243 for adding the values of the L stages of the shift register 241, and a division circuit 245 for dividing the addition result by the sample count L.

In the normalization section 244, the moving average value vk is divided by the average value |y|avg of the absolute values of the PR signal amplitude, and as shown in the following Expression (2), so as to calculate the normalized moving average value vk'.

[Expression 2]

$$v_k' = v_k / |y|_{avg} \quad (2)$$

The length for averaging the absolute values of the PR signal amplitude may be determined by a sequential computation similar to Expression (1), targeting the sampling period that is sufficiently longer than the moving average range L, or it may be set in advance. To set the value in advance, the absolute values of the signal detection expected values in the SISO decoder 234 may be averaged and set.

If the recording code has a restriction which could influence the generation probability of each expected value, the generation probability is considered to determine the average value.

As Expression (3) shows, the scaling factor conversion section 246 converts v'k, which is "1" or more, into "1", and converts v'k, which is less than the threshold Th, into a scaling factor "a" which is an arbitrary value. Here $0 \leq a \leq Th$ must be satisfied. If v'k is the threshold Th or more and less than "1", v'k is directly used as the scaling factor.

[Expression (3)]

$$\alpha_k = \begin{cases} 1, & v_k' \geq 1 \\ v_k', & T_h \leq v_k' < 1 \\ a, & v_k' < T_h \end{cases} \quad (3)$$

In other words, the scaling factor α is set to value "1", which does not influence the likelihood (reliability information) of the SISO decoder 234 for an area other than an area where a defect may exist, and is set to "v'k" according to the degree of the drop in amplitude for an area where a defect may exist. Also for an area which can be judged that a defect smaller than the threshold Th exists, the scaling factor α is forcibly set to "a". If "a" is set to "0", the reliability information is undefined.

If the threshold Th is set to "0", the scaling factor α becomes "1", that is a value which does not influence the likelihood (reliability information) of the SISO decoder 234, for an area other than an area where a defect may exist, and becomes "v'k" according to the degree of the drop in amplitude for an area where a defect may exist.

First Embodiment of Defect Correction Decoder

Figure 6:
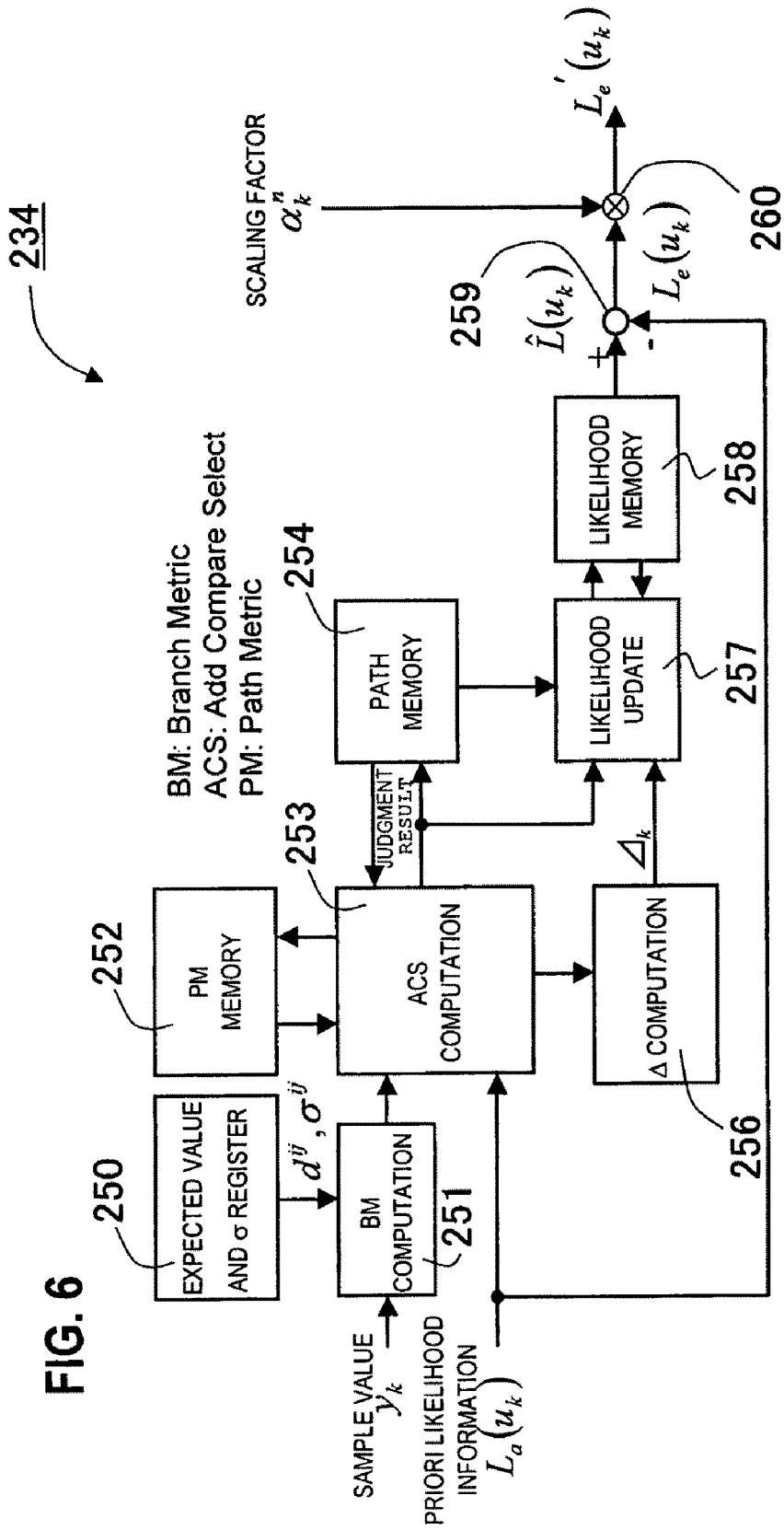
FIG. 6 is a block diagram depicting the first embodiment of the defect correction decoder in FIG. 1.
Figure 7:
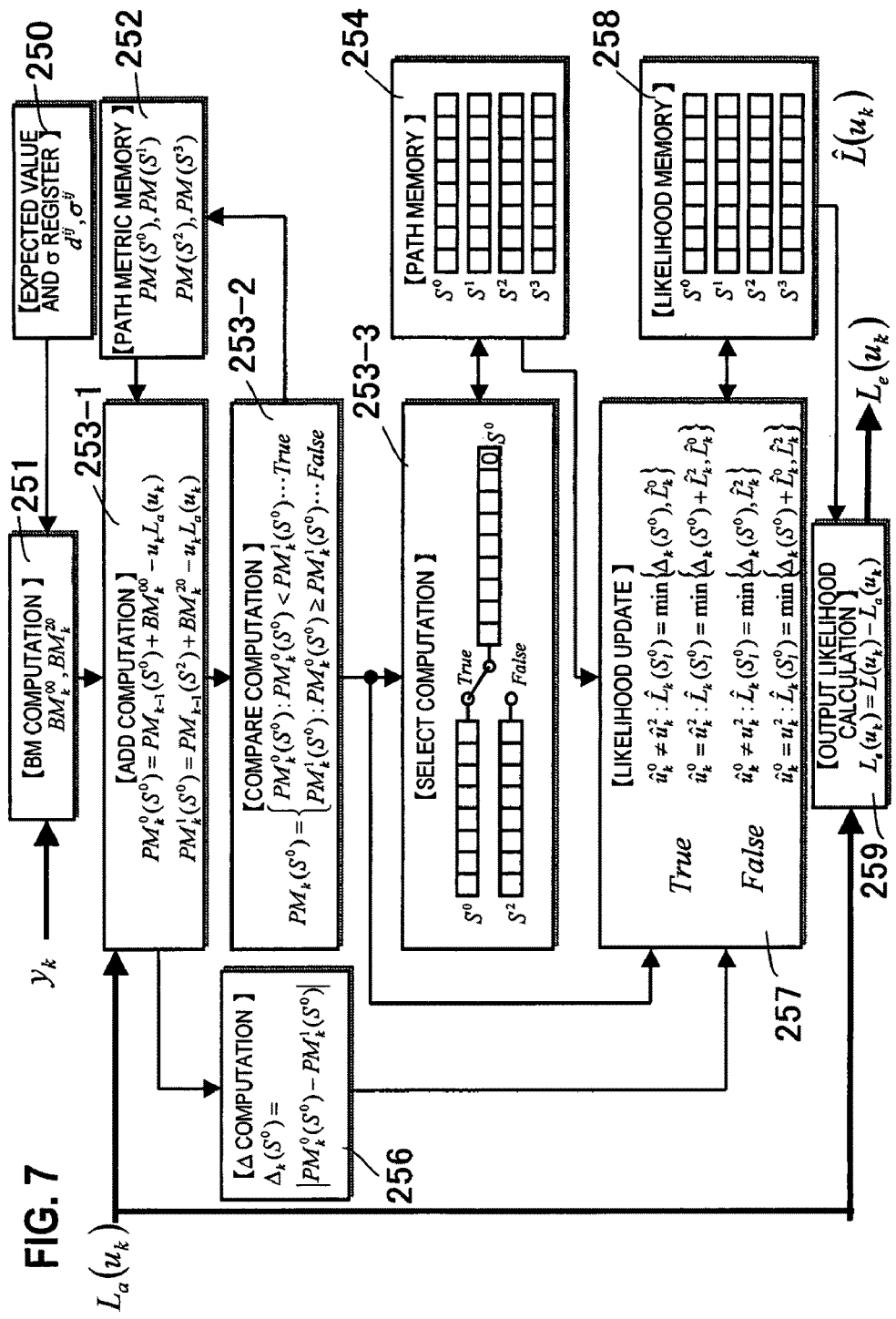
FIG. 7 is a detailed block diagram of FIG. 6.
Figures 8, 9:
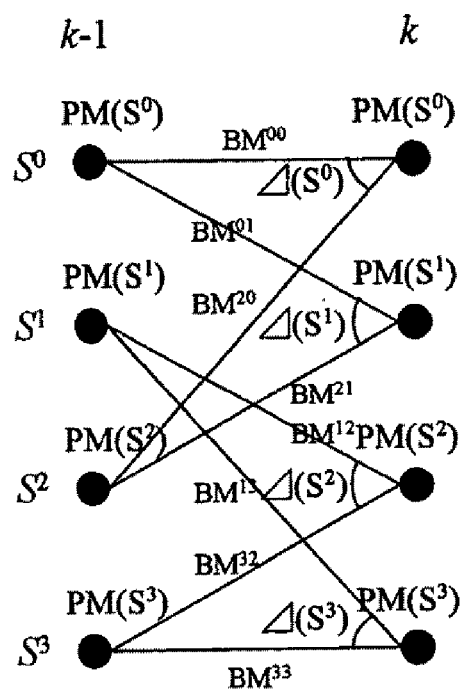
FIG. 8 shows the state transition for describing FIG. 6.
FIG. 9 is a trellis diagram of FIG. 8.
Figure 10:
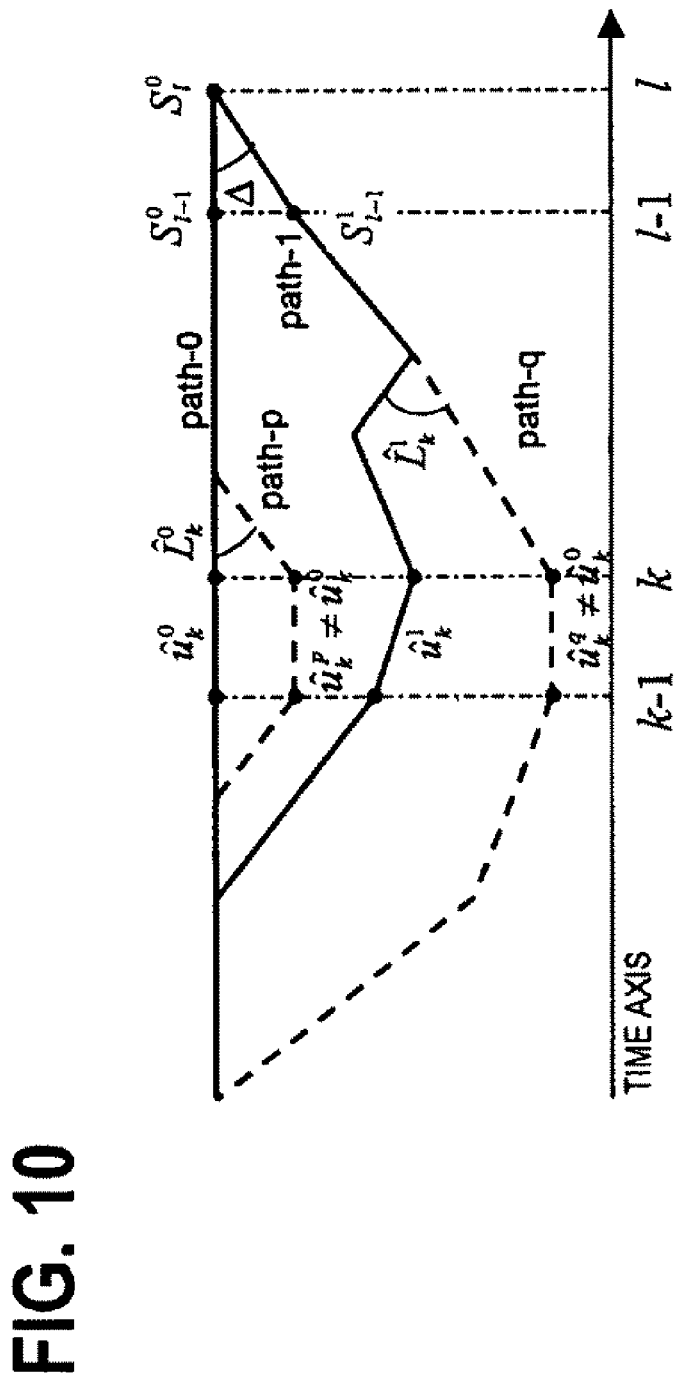
FIG. 10 is a diagram depicting the operation of the SOVA method in FIG. 6.

FIG. 6 is a block diagram depicting the first embodiment of the defect correction decoder (SISO decoder) in FIG. 1, FIG. 7 is a detailed block diagram of FIG. 6, FIG. 8 is a state transition diagram depicting FIG. 6, FIG. 9 is a trellis diagram of the decoder in FIG. 6, and FIG. 10 is a diagram depicting the SOVA method in FIG. 6.

FIG. 6 shows a decoder based on the SOVA method as the SISO decoder 234. As FIG. 6 and FIG. 7 show, the SISO decoder 234 is comprised of a register 250 for storing an expected value (decoder input) d and a noise dispersion value σ^2, a BM computing section 251 for computing a branch metric value BM for an input value yk using the expected value d and the noise dispersion value, a path metric memory 252 for storing a path metric value, and an ACS computing section 253 for updating a path metric value using a priori likelihood information La (uk) and a branch metric value, comparing the two path metric values, and selecting a path.

The SISO decoder 234 is further comprised of a path memory 254 for storing path select information, Δ computing section 256 for computing a difference, a likelihood update section 257 for updating the likelihood, a likelihood memory 258 for storing the likelihood, and an output likelihood calculation section 259 for calculating an output likelihood Le (uk) from the likelihood of the likelihood memory 258 and the priori likelihood information.

Now the operation of the SISO decoder 234 will be described with reference to FIG. 7 to FIG. 10, using a method for decoding an equalized series after equalizing PR (1, 2, 1), based on the SOVA method as an example.

FIG. 8 shows a state transition table in the decoder in the case of PR (1, 2, 1). This table shows the decoder input signal value (expected value) d which is expected for the recorded value. The decoder estimates the most likely recorded data based on this expected value d. FIG. 9 shows a trellis diagram of the decoder in the case of PR (1, 2, 1), and is a diagram depicting FIG. 8.

In other words, an expected value is given to each branch for the four states S0-S3 at a point in time (k−1) and four states S0-S3 at point in time k respectively, and an optimum path is selected so that errors are minimized.

Now this will be described with reference to FIG. 7. Here $\sigma^2$ is a noise dispersion value, d is an expected value (decoder input) shown in FIG. 8, and La (uk) is a priori likelihood information at time k. Further, i and j indicate the transition from state Si at time (k−1) to state Sj at time k respectively.

First the BM computing section 251 receives an input sample value yk, and computes branch metric values BMk (2 branch metric values) by the following Expression (4) using an expected value d and the noise dispersion value in the register 250.

[Expression 4]

$$BM_k^{ij} = -\ln \frac{1}{\sqrt{2\pi\sigma^2}} \exp\left(-\frac{(y_k - d_k^{ij})^2}{2\sigma^2}\right) \quad (4)$$

The addition computing section 253-1 of the ACS computing section 253 computes a path metric value at time k by the following Expression (5) from the path metric value PM of the path metric memory 252, the computed branch metric values BM, and a priori likelihood information La (uk).

[Expression 5]

$$PM_k^0(S^0) = PM_{k-1}(S^0) + BM_k^{00} - U_k L_a(U_k)$$

$$PM_k^1(S^0) = PM_{k-1}(S^2) + BM_k^{20} - U_k L_a(U_k) \quad (5)$$

The comparison computing section 253-2 of the ACS computing section 253 compares the computed path metric values at time k, computed by the following Expression (6), and regards the smaller value as a path metric value at time k, and updates the path metric memory 252.

[Expression 6]

$$PM_k(S^0) = \begin{cases} PM_k^0(S^0) : PM_k^0(S^0) < PM_k^1(S^0) \\ PM_k^1(S^0) : PM_k^0(S^0) \geq PM_k^1(S^0) \end{cases} \quad (6)$$

The selection computing section 253-3 of the ACS computing section 253 updates the path select information of the path memory 254 according to the comparison result of the comparison computing section 253-2.

The Δ computing section 256 computes the difference Δk (S0) of the two path metric values computed by the addition computing section 253-1 by the following Expression (7).

[Expression 7]

$$\Delta_k(S^0) = |PM_k^0(S^0) - PM_k^1(S^0)| \quad (7)$$

Then L (u) is set as a log-likelihood ratio (LLR) to an information symbol u. The log-likelihood ratio is reliability information for binary recorded data. The likelihood update section 257 selects the smaller one of the log-likelihood ratio L (u) of the likelihood memory 258 and the difference in the Δ computing section 256 as the log-likelihood ratio, and updates the likelihood memory 258.

The output likelihood calculation section 259 subtracts the priori likelihood La (uk) from the log-likelihood ratio of the likelihood memory 258, and outputs the output likelihood Le (uk).

Now a concrete operation principle will be described according to FIG. 10. The information symbol u (recorded data) is binary, "1" or "0", and a symbol with "^" thereon indicates a decoded value. L (u) is a log-likelihood ratio to the information symbol u, as mentioned above.

In the SOVA method, a likelihood memory 258 with path memory length is provided for each state S0-S3, in addition to the path memory used for a Viterbi decoding. In the SOVA method, the reliability information L (u) is updated according to the following rule.

The survival path in state S0−1 at time (1−1) is regarded as path −0, and the likelihood to be held for the symbol $u^{\wedge 0}k$ at time k in this state is given by the following Expression (8).

[Expression 8]

$$\hat{L}_k(S_{l-1}^0) = \hat{L}_k^0 \quad (8)$$

In the same way, a survival path at Sl−1 a time (l−1), is regarded as path −1, and the likelihood to be held for the symbol $u^{\wedge 1}k$ at time k in this state is given by the following Expression (9).

[Expression 9]

$$\hat{L}_k(S_{l-1}^1) = \hat{L}_k^1 \quad (9)$$

It is assumed that path −0 and path −1 merge, and the path −0 becomes a survival path at time l, and the path metric difference is assumed to be Δ.

When $u^{\wedge 0}k \neq u^{\wedge 1}k$, a path which is in contention with the survival path path −0 is path −p because $u^{\wedge p}k \neq u^{\wedge 0}k$, and path −1 because $u^{\wedge 0}k \neq u^{\wedge 1}k$. The path −q is not in contention since $u^{\wedge p}k \neq u^{\wedge 0}k$. The metric difference from the path −0 is $L^{\wedge 0}k$ and Δ respectively, so the reliability information at time l is given by the following Expression (10).

[Expression 10]

$$\hat{L}_k(s_l) = \min\{\Delta, \hat{L}_k^0\} \quad (10)$$

When $u^{\wedge 0}k = u^{\wedge 1}k$, on the other hand, a path which is in contention with the survival path path −0 is path −p because $u^{\wedge p}k \neq u^{\wedge 0}k$, and path −q because $u^{\wedge q}k \neq u^{\wedge 1}k = u^{\wedge 0}k$. The metric difference with the path −0 is $L^{\wedge 0}k$ and $\Delta + L^{\wedge 1}k$ respectively, so the reliability information at time l is given by the following Expression (11).

[Expression 11]

$$\hat{L}_k(s_l) = \min\{\Delta + \hat{L}_k^1, \hat{L}_k^0\} \quad (11)$$

In the iterative decoding, the log-likelihood ratio to be output is given by the following Expression (12), as is described in the output likelihood calculation section 259 in FIG. 7.

[Expression 12]

$$L_e(u_k) = \hat{L}(u_k) - L_a(u_k) \quad (12)$$

In the first embodiment, the scaling factor α acquired by the defect detector in FIG. 5 is raised to the n-th power (n is 1 or more), and the result of Expression (12) which is the output of the SISO decoder is multiplied by an in the multiplication unit 260 in FIG. 6, as shown in the following Expression (13).

[Expression 13]
$$L_e'(u_k) = L_e(u_k) \cdot \alpha^n \qquad (13)$$

By correcting the reliability information with the scale factor, as described above, error propagation can be suppressed.

Second Embodiment of Defect Correction Decoder

FIG. 11 is a block diagram depicting the second embodiment of the defect correction decoder (SISO decoder) in FIG. 1. In FIG. 11, composing elements the same as FIG. 6 are denoted with the same reference symbols, and a decoder based on the SOVA method is shown as the SISO decoder 234.

As FIG. 11 shows, the SISO decoder 234 is comprised of a register 250 for storing an expected value (decoder input) d and a noise dispersion value $\sigma^2$, a BM computing section 251 for computing a branch metric value BM for an input value yk using the expected value d and the noise dispersion value, a path metric memory 252 for storing a path metric value, and an ACS computing section 253 for updating a path metric value using a priori likelihood information La (uk) and a branch metric value, comparing the two path metric values and selecting a path.

The SISO decoder 234 is further comprised of a path memory 254 for storing path select information, Δ computing section 256 for computing a difference, a likelihood update section 257 for updating the likelihood, a likelihood memory 258 for storing the likelihood, and an output likelihood calculation section 259 for calculating an output likelihood Le (uk) from the likelihood of the likelihood memory 258 and the priori likelihood information.

In the second embodiment, the scaling factor α acquired by the defect detector in FIG. 5 is raised to the n-th power (n is 1 or more), and BMij in Expression (4), which is the calculation of the SISO decoder 234, is multiplied by an $\alpha^n$, as shown in the following Expression (14), in the multiplication unit 261.

[Expression 14]
$$BM_k^{ij} = \left\{ -\ln \frac{1}{\sqrt{2\pi\sigma^2}} \exp\left(-\frac{(y_k - d_k^{ij})^2}{2\sigma^2}\right) \right\} \cdot \alpha_k^n \qquad (14)$$

Third Embodiment of Defect Correction Decoder

Figure 12:
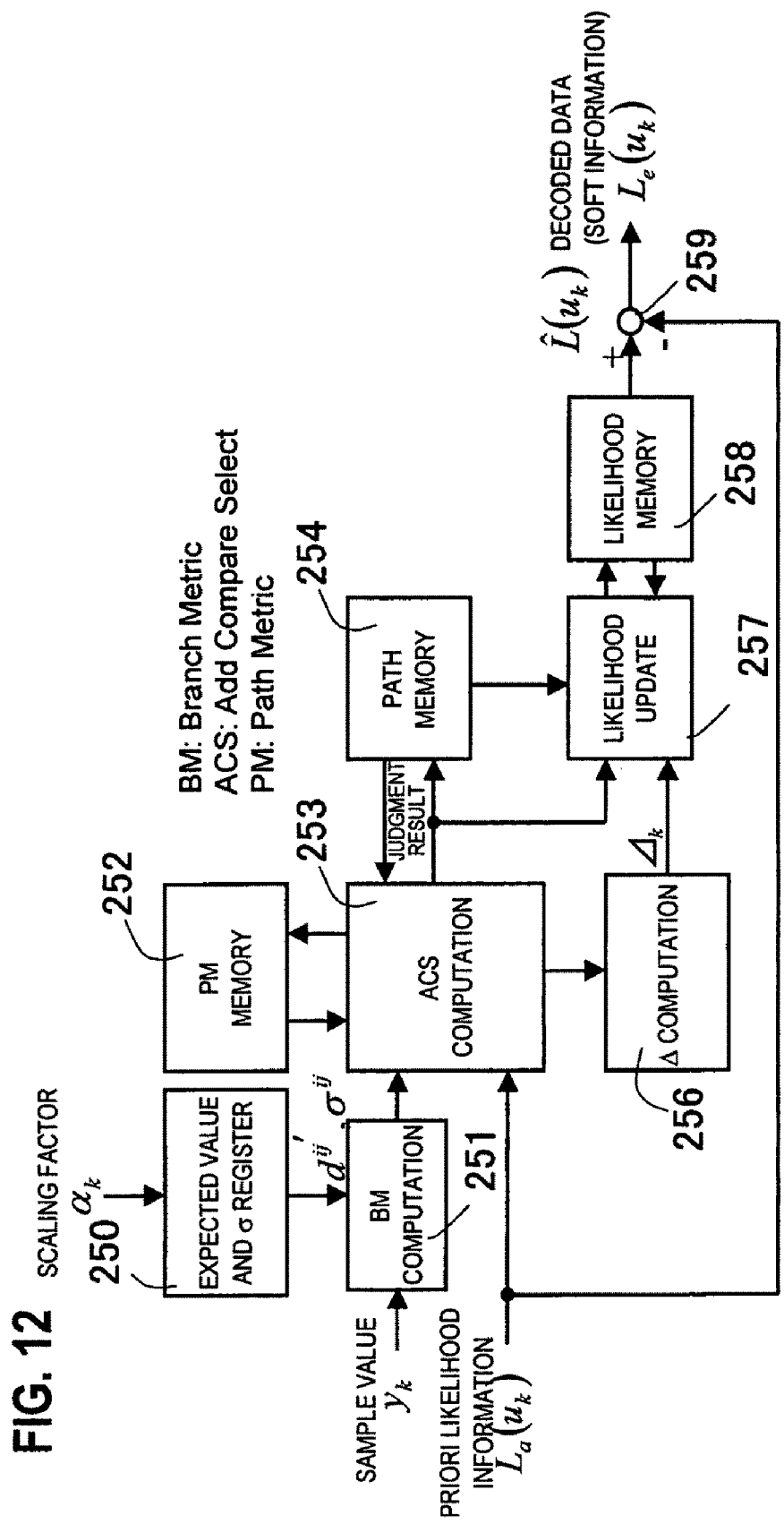
FIG. 12 is a block diagram depicting the third embodiment of the defect correction decoder in FIG. 1.

FIG. 12 is a block diagram depicting the third embodiment of the defect correction decoder (SISO decoder) in FIG. 1. In FIG. 12, composing elements the same as FIG. 6 are denoted with the same reference symbols, and a decoder based on the SOVA method is shown as the SISO decoder 234.

As FIG. 12 shows, the SISO decoder 234 is comprised of a register 250 for storing an expected value (decoder input) d and a noise dispersion value $\sigma^2$, a BM computing section 251 for computing a branch metric value BM for an input value yk using the expected value d and the noise dispersion value, a path metric memory 252 for storing a path metric value, and an ACS computing section 253 for updating a path metric value using a priori likelihood information La (uk) and a branch metric value, comparing the two path metric values and selecting a path.

The SISO decoder 234 is further comprised of a path memory 254 for storing path select information, Δ computing section 256 for computing a difference, a likelihood update section 257 for updating the likelihood, a likelihood memory 258 for storing the likelihood, and an output likelihood calculation section 259 for calculating an output likelihood Le (uk) from the likelihood of the likelihood memory 258 and the priori likelihood information.

In the third embodiment, the scaling factor α acquired by the defect decoder in FIG. 5 is raised to the n-th power (n is 1 or more), and dij in the register 250 in Expression (4), which is the calculation of the SISO decoder 234, is multiplied by $\alpha^n$, as shown in the following Expression (15).

[Expression 15]
$$d_k^{ij'} = d_k^{ij} \cdot \alpha_k \qquad (15)$$

Fourth Embodiment of Defect Correction Decoder

Figure 13:
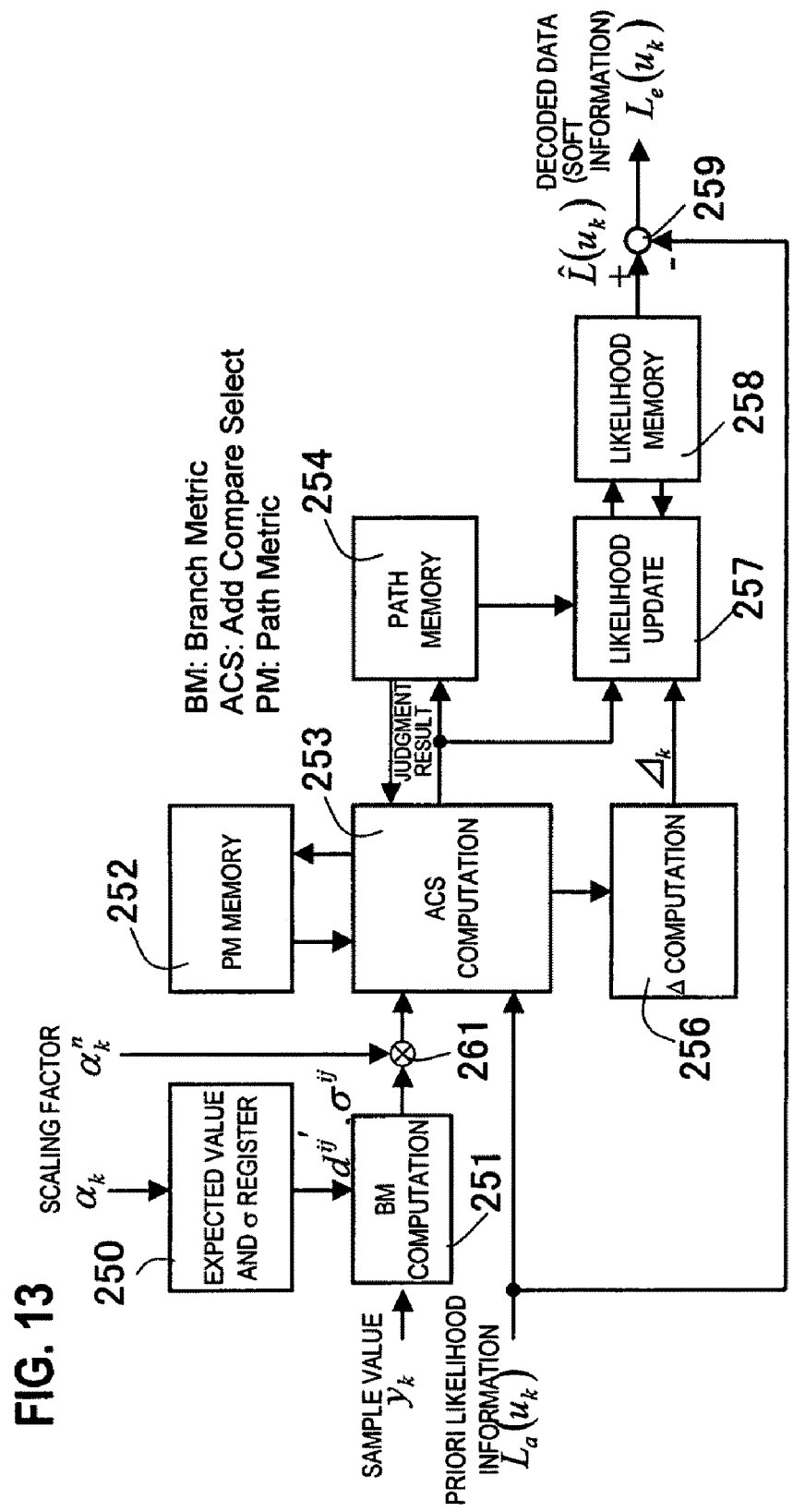
FIG. 13 is a block diagram depicting the fourth embodiment of the defect correction decoder in FIG. 1.

FIG. 13 is a block diagram depicting the fourth embodiment of the defect correction decoder (SISO decoder) in FIG. 1. In FIG. 13, composing elements the same as FIG. 6 are denoted with the same reference symbols, and a decoder based on the SOVA method is shown as the SISO decoder 234.

As FIG. 13 shows, the SISO decoder 234 is comprised of a register 250 for storing an expected value (decoder input) d and a noise dispersion value $\sigma^2$, a BM computing section 251 for computing a branch metric value BM for an input value yk using the expected value d and noise dispersion value, a path metric memory 252 for storing a path metric value, and an ACS computing section 253 for updating a path metric value using a prior likelihood information La (uk) and a branch metric value, comparing the two path metric values and selecting a path.

The SISO decoder 234 is further comprised of a path memory 254 for storing path select information, Δ computing section 256 for computing a difference, a likelihood update section 257 for updating the likelihood, a likelihood memory 258 for storing the likelihood, and an output likelihood calculation section 259 for calculating an output likelihood Le (uk) from the likelihood of the likelihood memory 258 and the priori likelihood information.

In the fourth embodiment, which is a combination of the second embodiment and third embodiment, the scaling factor α acquired by the defect detector in FIG. 5 is raised to the n-th power (n is 1 or more), and BMij in Expression (4), which is the calculation of the SISO decoder 234, is multiplied by $\alpha^n$, as shown in the following Expression (16).

[Expression 16]
$$BM_k^{ij} = \left\{ -\ln \frac{1}{\sqrt{2\pi\sigma^2}} \exp\left(-\frac{(y_k - d_k^{ij} \cdot \alpha_k)^2}{2\sigma^2}\right) \right\} \cdot \alpha_k^n \qquad (16)$$

In this case, the values of the scaling factor by which the expected value d is multiplied and the scaling factor by which the branch metric BM is multiplied need not be the same, and it is preferable that the scaling factor by which the expected value d is multiplied and the scaling factor by which the branch metric BM is multiplied are set to different values, α1 and α2 respectively, for example.

Another Embodiment of Defect Detector

Figure 14:
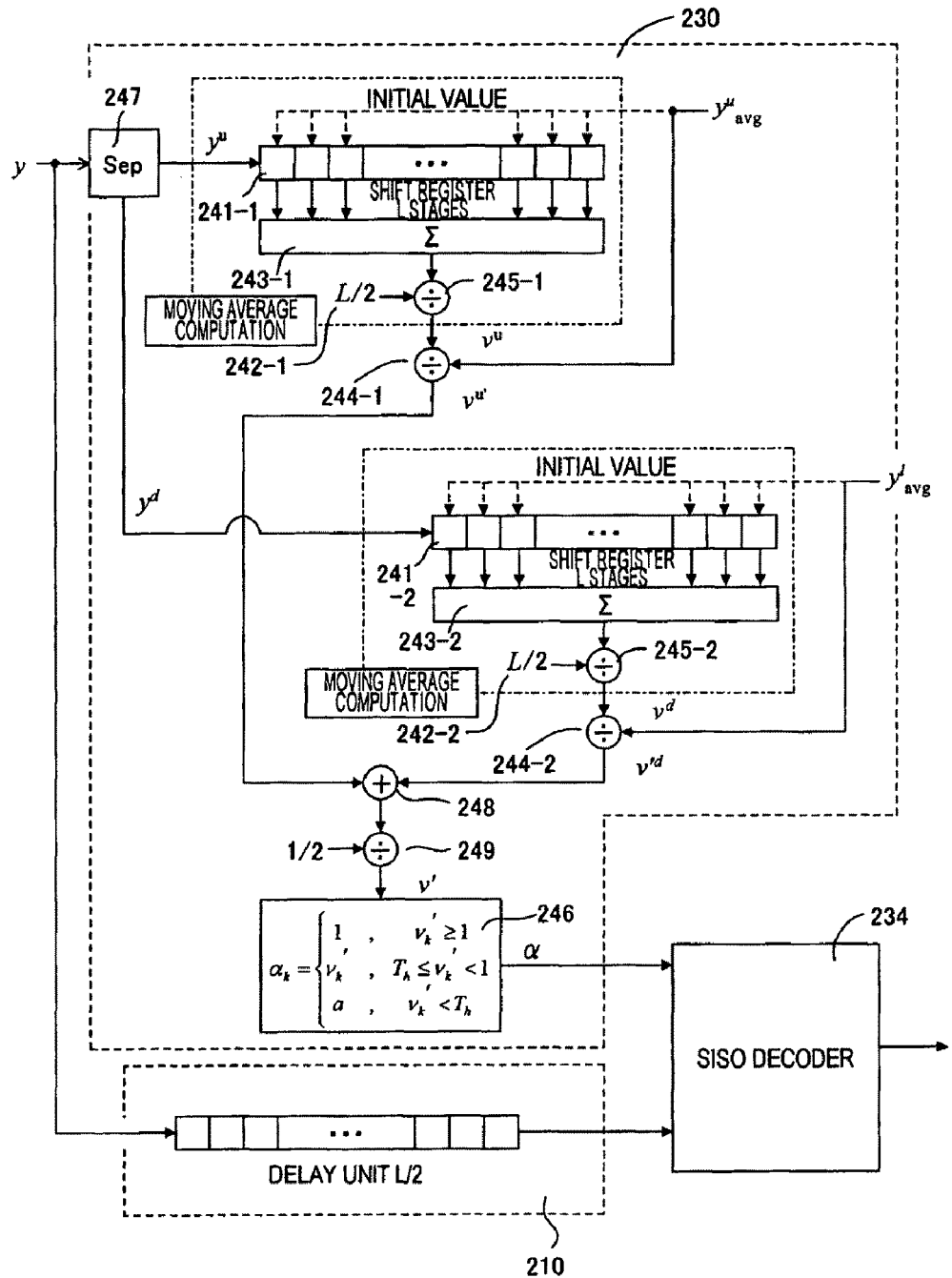
FIG. 14 is a block diagram depicting the second embodiment of the defect detector in FIG. 1.

Another configuration of the defect detector 230 in FIG. 1 will now be described. FIG. 14 is a block diagram depicting another embodiment of the defect detector 230 in FIG. 1.

As FIG. 14 shows, the defect detector 230 is comprised of a separation section 247 for separating an equalization signal y into upper and lower sides by the central value, an upper moving average computing section 242-1, a lower moving average computing section 242-2, an upper normalization section 244-1, a lower normalization section 244-2, a composite section 248, a division section 249 and a scaling factor conversion section 246.

The separation section 247 separates the PR equalized series y into an upper side and a lower side of the signal of the PR equalized series y, as shown in FIG. 2, with the DC level as the center. In other words, the average value of the PR equalized series y is calculated, the average value is set to "0", and the PR equalized series y is separated into an upper part and a lower part.

A first moving average computing section 242-1 and a second moving average computing section 242-2 compute the moving average of the range of the L samples for the upper signal yu and the lower signal yd of the PR equalized series respectively. The upper and lower moving average values vuk and vdk are calculated by the following Expression (17).

[Expression 17]

$$v_k^u = \frac{1}{L/2} \sum_{n=-L/2}^{+L/2} y_{k+n}^u$$

$$v_k^d = \frac{1}{L/2} \sum_{n=-L/2}^{+L/2} y_{k+n}^d$$
(17)

In other words, the moving average values vuk and vdk of the k samples are calculated by adding the upper amplitude and lower amplitude in the range of the L samples with the sampling point k at the center, and dividing the result by the range L. The range L is preferably a power of 2 in order to decrease the calculation volume in the division. In other words, division can be performed by bit shift.

In this case $L=2^m$, and m is greater than the PR restricted length (e.g. in the case of PR-4, the restricted length is "3" because the possible values are 1, 0, -1). That is, m>PR restricted length. This means that if m is the PR restricted length or less, the generation of all the PR patterns is not guaranteed, and therefore a detection error may occur.

The first and second moving average computing sections 242-1 and 242-2 are comprised of the L stages of the shift registers 241-1 and 241-2 for the above mentioned L samples, addition circuits 243-1 and 243-2 for adding the values of the L stages of the shift registers 241-1 and 241-2, and division circuits 245-1 and 245-2 for dividing the addition results by the sample count L/2 respectively.

In the normalization sections 244-1 and 244-2, the moving average values vuk and vdk are divided by the average value of the upper amplitude and average value of the lower amplitude of the PR signal amplitude respectively, as shown in the following Expression (18), so as to calculate the normalized moving average values vuk' and vdk'.

[Expression 18]

$$v_k^{u'} = v_k^u / y_{avg}^u$$

$$v_k^{d'} = v_k^d / y_{avg}^d$$
(18)

The length of equalizing the PR signal amplitude may be determined by a sequential computation similar to Expression (17), targeting the sampling period N, that is sufficiently longer than the moving average range L, or it may be set in advance.

The composite section 248 and the division section 249 combine the upper and lower moving average values by the following Expression (19).

[Expression 19]

$$v_k' = \frac{1}{2}(v_k^{u'} + v_k^{d'})$$
(19)

As Expression (3) shows, the scaling factor conversion section 246 converts v'k, which is "1" or more, into "1", and converts v'k, which is less than the threshold Th, into a scaling factor "a", which is an arbitrary value, just like the case of FIG. 5. Here $0 \leq a \leq Th$ must be satisfied. If v'k is the threshold Th or more and less than "1", v'k is directly used as the scaling factor.

In other words, the scaling factor α is set to value "1", which does not influence the likelihood (reliability information) of the SISO decoder 234 for an area other than an area where a defect may exist, and is set to "v'k" according to the degree of the drop in amplitude for an area where a defect may exist. Also for an area which can be judged that a defect smaller than the threshold Th exists, the scaling factor α is forcibly set to "a". If "a" is set to "0", the reliability information is undefined.

If the threshold Th is set to "0", the scaling factor α becomes "1", that is a value which does not influence the likelihood (reliability information) of the SISO decoder 234, for an area other than an area where a defect may exist, and becomes "v'k" according to the degree of the drop in amplitude for an area where a defect may exist.

In this way, for simple threshold detection, a moving average value is calculated, and the scaling factor is acquired by this calculation result, so micro-defects can be detected accurately, and deterioration of error correction capability due to a detection error can be suppressed.

If the asymmetry of the signal amplitude is major, for such reasons as the characteristics of the magnetic head, good defect detection can be performed by using this embodiment.

Another Embodiment of Recording/Reproducing Device

Figure 15:
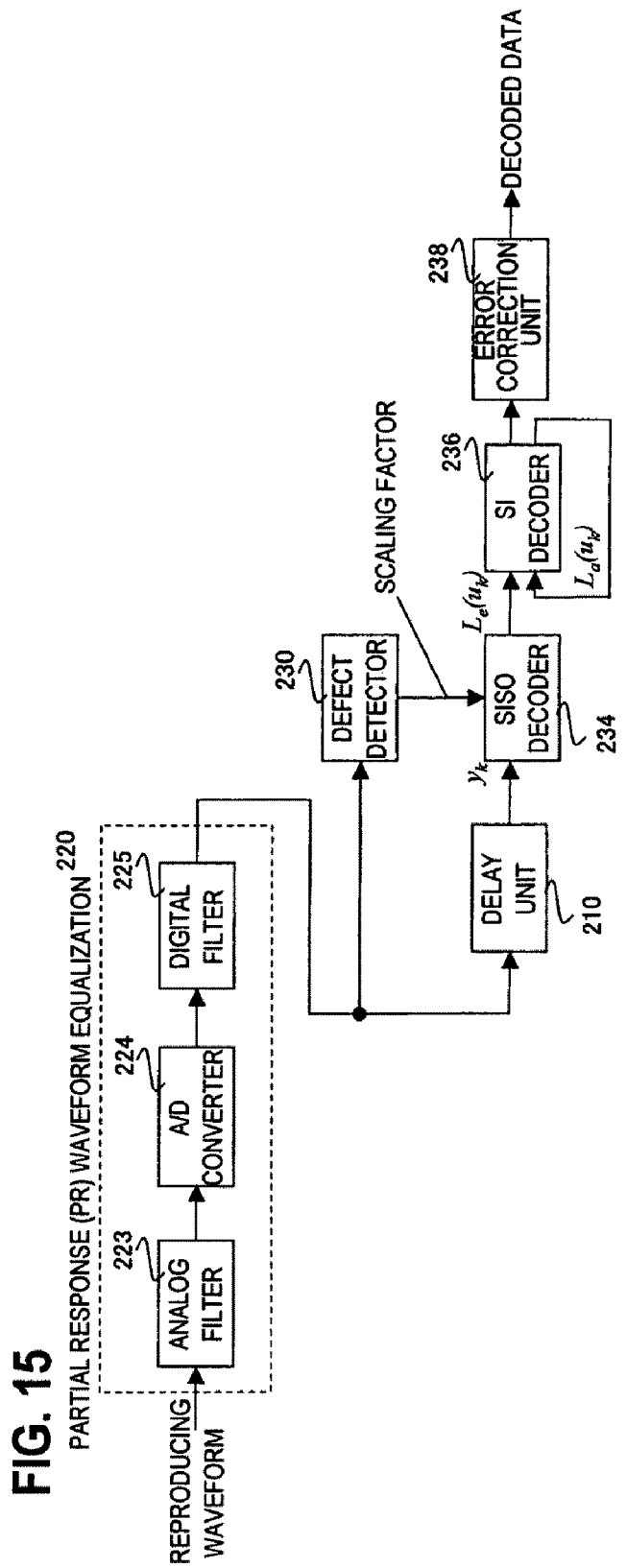
FIG. 15 is a block diagram depicting an embodiment of the recording/reproducing device according to the present invention.

FIG. 15 is a block diagram depicting another embodiment of a recording/reproducing device of the present invention, and shows a iterative decoding type recording/reproducing device of a magnetic disk device as an example. In FIG. 15, composing elements the same as FIG. 1 are denoted with the same reference symbols.

Just like FIG. 1, a reproducing waveform in FIG. 15 is a data of a magnetic disk read by a head and amplified by a preamplifier, which is not illustrated. The data of the magnetic disk is user data to which an error correction code (ECC) is added, comprised of K bits of data and M bits of parity added. For the parity code, LDPC (Low Density Parity Code), for example, can be used.

The reproducing waveform from this head is adjusted for amplitude by a variable gain amplifier, which is not illustrated, and is input to a PR waveform equalization section 220. In the PR waveform equalization section 220, an analog (low pass) filter (LPF) 223 cuts a high frequency band of the reproducing signal of which amplitude has been adjusted, and an A/D converter (ADC) 224 converts the analog output thereof into digital signals. Then a digital filter 225, such as an FIR (Finite Impulse Response) filter, performs waveform equalization, and the PR equalized series y is acquired.

The PR equalized series y is delayed in a delay unit 210 by the amount of delay generated due to the defect detection operation of a defect detector 230, and is input to the SISO decoder 234. The SISO decoder 234 is a soft-input soft-output (SISO) decoder for decoding the PR equalized series y. The soft-output (reliability information) Le (uk) of the SISO decoder 234 is input to a soft-input decoder 236 for low density parity check (LDPC) codes.

For the soft-input soft-output decoder 234, BCJR (Bahl-Cocke-Jelinek-Raviv), MAP (Maximum A Posterior) decoding, and SOVA (Soft Output Viterbi Algorithm), for example, are used.

For the soft-input decoder 236, Sum-product (SP) decoding and Min-Sum decoding, for example are used, and iteratively updates the likelihood (reliability information). The soft-input decoder 236 receives the reliability information Le (uk) from the soft-input soft-output decoder 234, updates the reliability information La (uk) respectively, and when it is judged as no error after a predetermined number of times of decoding or in a parity check, the soft-input decoder 236 judges the reliability information as "1" or "0" based on the threshold, an error correction decoder 228 corrects errors using an error correction code, and outputs the user data. The error correction decoder 228 is an ECC decoder, for example.

In other words, the SI decoder 236 repeatedly decodes the reliability information La (uk) for the recorded data "0" or "1" under predetermined conditions. After iteration is over, the reliability information is hardly judged as "0" or "1", and is output to the error correction unit 238.

In this embodiment as well, the defect detector 230 computes a moving average in an L sampling length for the input signal y of the soft-input soft-output decoder, divides the moving-averaged signal by the average level value of the input signal y (average value in sampling length sufficiently longer than L) for normalization, and from the quotient, a scaling factor α, which is limited to "1" when the quotient is "1" or more, is generated.

Then the reliability information of the SISO decoder 234 is manipulated by this scaling factor α. This scaling factor α is raised to the n-th power (n is 1 or more). For the operation of the SISO decoder 234, one of the methods, A, B and C, is used, as mentioned above.

In the present embodiment, the form of iterative decoding is different from the first embodiment (FIG. 1), and an example when iterative decoding is performed only by the SI decoder 236 is shown, but manipulating the SISO decoder 234 with the scaling factor is the same as the first embodiment.

Other Embodiments

In addition to the above embodiments, the first embodiment and the third embodiment of the defect correction decoder may be combined. An example of using the recording/reproducing device of the magnetic disk device was described, but the present invention can be applied to other medium storage devices, such as an optical disk device and a tape device.

The present invention was described using embodiments, but the present invention can be modified in various ways within the scope of the essential character thereof, and these variant forms shall not be excluded from the scope of the present invention.

A moving average value is computed for simple threshold detection, and a scaling factor is acquired from this result, so micro-defects can be accurately detected and the reliability information of the soft-input soft-output decoder is manipulated, therefore error propagation due to micro-defects can be suppressed.

What is claimed is:

1. A decoder, comprising:
    a soft-input soft-output decoder for decoding channel reproducing signals which have inter-symbol interference;
    a soft-input decoder for decoding a soft output of the soft-input soft-output decoder; and
    a weighting computing unit for detecting both sided amplitude fluctuation of a soft-input signal of the soft-input soft-output decoder, and outputting a weight value according to a drop in amplitude,
    wherein a soft output value of the soft-input soft-output decoder decreases the soft output value by the weight value, and a decoding process is performed by propagating reliability information between the soft-input soft-output decoder and the soft-input decoder, and
    wherein the weighting computing unit comprises: an absolute value encoding section for reflecting the soft-input signal at an amplitude center value;
    a moving average computing section for computing a moving average value in a predetermined range;
    a normalization computing section for dividing the moving average value by an average value of all the absolute value signals; and
    a weighting generation section for generating the weight value as "1" when the normalization computing value is "1" or more, and as the normalization computing value when the normalization computing value does not exceed "1".

2. The decoder according to claim 1, wherein when the normalization computing value is a threshold T or less, the weighting generation section further generates a weight value of "0" or more and less than T.

3. The decoder according to claim 1, wherein
    the weighting computing section further comprises:
    a separation section for setting the amplitude center value of the soft-input signal as "0", and separating the soft-input signal into an upper signal having a value of 0 or more, and a lower signal having a values less than 0;
    an upper signal moving average computing section for computing a moving average value in a predetermined range for the upper signal;
    a lower signal moving average computing section for computing a moving average value in a predetermined range for the lower signal;
    an upper normalization computing section for dividing the upper moving average value by an average value of all the upper signals;
    a lower normalization computing section for dividing the lower moving average value by an average value of all the lower signals;
    a composite computing section for combining the upper and lower normalization computing values; and
    a weighting generation section for generating the weight value as "1" when the composite computing value is "1" or more, and as the normalization computing value when the composite computing value does not exceed "1".

4. The decoder according to claim 3, wherein when the normalization computing value is threshold T or less, the weighting generation section further generates a weight value of "0" or more and less than T.

5. The decoder according to claim 1, wherein the soft-input soft-output decoder comprises a reliability weighting section for generating weighting reliability information by multiplying reliability information, that is the soft-output signal, by an n-th power weight value, which is the weight value output from the weighting computing section raised to the n-th power (n is 1 or more).

6. The decoder according to claim 3, wherein the first and second normalization computing sections set the central value of a soft-input expected value in the soft-input soft-output decoder to zero, and use a resulting value when the total of expected values 0 or more is divided by 2 as the average value of all the upper signals, and a resulting value when the total of expected values less than 0 is divided by 2 as the average value of all the lower signals.

7. The decoder according to claim 1, wherein the soft-input soft-output decoder further comprises:
   a branch metric computing section for generating reliability information based on a Euclidian distance between the soft-input signal and a soft-input expected value; and
   a weighting soft-input expected value computing section for multiplying the soft-input expected value by a weight value which is output from the weighting computing section.

8. The decoder according to claim 1, wherein the soft-input soft-output decoder further comprises:
   a branch metric computing section for generating reliability information based on a Euclidian distance between the soft-input signal and a soft-input expected value; and
   a weighting branch metric computing section for generating a weighting branch metric by multiplying the branch metric computing result by an n-th power weight value, which is the weight value output from the weighting computing section raised to the n-th power (n is 1 or more).

9. The decoder according to claim 1, wherein the normalization computing section sets the central value of a soft-input expected value of the soft-input soft-output decoder to zero, and uses a resulting value when the total of the absolute values thereof is divided by 2 as an average value of the absolute values.

10. A reproducing device, comprising:
    a waveform equalizer for equalizing a reproducing waveform into channel reproducing signals which have inter-symbol interference;
    a soft-input soft-output decoder for decoding the channel reproducing signals;
    a soft-input decoder for decoding external encoding; and
    a weighting computing unit for detecting both sided amplitude fluctuation of a soft-input signal of the soft-input soft-output decoder, and outputting a weight value according to a drop in amplitude,
    wherein a soft output value of the soft-input soft-output decoder is decreased by the weight value, and a decoding process is performed by propagating reliability information between the soft-input soft-output decoder and the soft-input decoder,
    and wherein the weighting computing unit comprises:
    an absolute value encoding section for reflecting the soft-input signal at an amplitude center value;
    a moving average computing section for computing a moving average value in a predetermined range;
    a normalization computing section for dividing the moving average value by an average value of all the absolute value signals; and
    a weighting generation section for generating the weight value as "1" when the normalization computing value is "1" or more, and as the normalization computing value when the normalization computing value does not exceed "1".

11. The reproducing device according to claim 10, wherein when the normalization computing value is a threshold T or less, the weighting generation section further generates a weight value of "0" or more or less than T.

12. The reproducing device according to claim 10, wherein the weighting computing section comprises:
    a separation section for setting the amplitude center value of the soft-input signal as "0", and separating the soft-input signal into an upper signal having a value of "0" or more, and a lower signal having a values of less than "0";
    an upper signal moving average computing section for computing a moving average value in a predetermined range for the upper signal;
    a lower signal moving average computing section for computing a moving average value in a predetermined range for the lower signal;
    an upper normalization computing section for dividing the upper moving average value by an average value of all the upper signals;
    a lower normalization computing section for dividing the lower moving average value by an average value of all the lower signals;
    a composite computing section for combining the upper and lower normalization computing values; and
    a weighting generation section for generating the weight value as "1" when the composite computing value is "1" or more, and as the normalization computing value when the composite computing value does not exceed "1".

13. The reproducing device according to claim 12, wherein when the normalization computing value is threshold T or less, the weighting generation section further generates a weight value of "0" or more and less than T.

14. The reproducing device according to claim 12, wherein the first and second normalization computing sections set the central value of a soft-input expected value in the soft-input soft-output decoder to zero, and use a resulting value when the total of expected values of 0 or more is divided by 2 as the average value of all the upper signals, and a resulting value when the total of expected values of less than 0 is divided by 2 as the average value of all the lower signals.

15. The reproducing device according to claim 10, wherein the soft-input soft-output decoder comprises a reliability weighting section for generating a weighting reliability information by multiplying the reliability information, that is the soft-output signal, by an n-th power weight value, which is the weight value output from the weighting computing section raised to the n-the power (n is 1 or more).

16. The reproducing device according to claim 10, wherein the soft-input soft-output decoder further comprises:
    a branch metric computing section for generating reliability information based on a Euclidian distance between the soft-input signal and a soft-input expected value; and
    a weighting soft-input expected value computing section for multiplying the soft-input expected value by a weight value which is output from the weighting computing section.

17. The reproducing device according to claim 10, wherein the soft-input soft-output decoder further comprises:
    a branch metric computing section for generating reliability information based on a Euclidian distance between the soft-input signal and a soft-input expected value; and
    a weighting branch metric computing section for generating a weighting branch metric by multiplying the branch metric computing result by an n-th power weight value, which is the weight value output from the weighting computing section raised to the n-th power (n is 1 or more).

18. The reproducing device according to claim 11, wherein the normalization computing section sets the central value of a soft-input expected value of the soft-input soft-output decoder to zero, and uses a resulting value when the total of the absolute values thereof is divided by 2 as an average value of the absolute values.

* * * * *

UNITED STATES PATENT AND TRADEMARK OFFICE
CERTIFICATE OF CORRECTION

PATENT NO. : 8,015,499 B2  
APPLICATION NO. : 11/981461  
DATED : September 6, 2011  
INVENTOR(S) : Toshikazu Kanaoka Page 1 of 1

It is certified that error appears in the above-identified patent and that said Letters Patent is hereby corrected as shown below:

Col. 19, line 4, claim 18 delete "claim 11" and insert --claim 10--.

Signed and Sealed this  
Third Day of April, 2012

David J. Kappos  
*Director of the United States Patent and Trademark Office*